United States Patent
Ha

(10) Patent No.: US 8,018,770 B2
(45) Date of Patent: Sep. 13, 2011

(54) PROGRAM AND SENSE OPERATIONS IN A NON-VOLATILE MEMORY DEVICE

(75) Inventor: Chang Wan Ha, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 249 days.

(21) Appl. No.: 12/274,508

(22) Filed: Nov. 20, 2008

(65) Prior Publication Data

US 2010/0124115 A1 May 20, 2010

(51) Int. Cl.
*G11C 11/34* (2006.01)

(52) U.S. Cl. .......... 365/185.14; 365/185.28; 365/185.11

(58) Field of Classification Search .............. 365/185.11, 365/185.14, 185.28
See application file for complete search history.

(56) References Cited

U.S. PATENT DOCUMENTS

| 7,212,445 B2 | 5/2007 | Cernea et al. |
| 2006/0087887 A1* | 4/2006 | Kameda et al. .......... 365/185.21 |
| 2008/0304316 A1* | 12/2008 | Mokhlesi .................... 365/185.2 |

\* cited by examiner

*Primary Examiner* — Hoai V Ho
*Assistant Examiner* — Anthan T Tran
(74) *Attorney, Agent, or Firm* — Leffert Jay & Polglaze, P.A.

(57) ABSTRACT

Methods for programming and sensing in a memory device, a data cache, and a memory device are disclosed. In one such method, all of the bit lines of a memory block are programmed or sensed during the same program or sense operation by alternately multiplexing the odd or even page bit lines to the dynamic data cache. The dynamic data cache is comprised of dual SDC, PDC, DDC1, and DDC2 circuits such that one set of circuits is coupled to the odd page bit lines and the other set of circuits is coupled to the even page bit lines.

13 Claims, 6 Drawing Sheets

PROGRAM AND SENSE OPERATIONS IN A NON-VOLATILE MEMORY DEVICE

TECHNICAL FIELD OF THE INVENTION

The present invention relates generally to memory devices and in a particular embodiment the present invention relates to non-volatile memory devices.

BACKGROUND OF THE INVENTION

Memory devices can include internal, semiconductor, integrated circuits in computers or other electronic devices. There are many different types of memory including random-access memory (RAM), read only memory (ROM), dynamic random access memory (DRAM), static RAM (SRAM), synchronous dynamic RAM (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

A typical read operation, also referred to as a sense operation, is comprised of grounding the source line of the memory block to be read, precharging the memory block data lines (e.g., bit lines), and biasing the access lines (e.g., word lines) in order to turn on all of the word lines except the word line to be read. A read voltage is then applied to the word line to be read and the select gates of alternate bit lines are turned on. If the bit line becomes discharged, the threshold voltage of the cell being read is less than the word line voltage. In this case, the cell is erased and is in a logical 1 state. If the bit line remains precharged, the threshold voltage of the cell being read is greater than the word line voltage that was applied to the word line being read. In this case, the memory cell is programmed and is in a logical 0 state.

A single level cell (SLC) non-volatile memory device has only two levels of threshold voltages to be programmed: a programmed state (i.e. logical 0) and an erased state (i.e., logical 1). A two bit multilevel cell (MLC) non-volatile memory device has four levels of threshold voltages: a logical 11 for an erased state and logical 00, 01, 10 for programmed states. The state of the MLC cell is determined using multiple SLC-like read operations to determine to which of the four levels of threshold voltages the cell being read belongs.

MLC devices can also have more than two bits of data stored requiring more than four different threshold voltage levels. As the number of levels stored on a cell increases, the number of read operations necessary to determine the data stored also increases. Increasing the number of read operations thus increases the overall read time for each cell and decreases the memory's performance.

There is a similar problem in programming MLC devices. A row of memory cells is comprised of multiple logical interleaved pages of memory cells. Each page is typically programmed separately. Thus, programming multiple states into multiple pages of each row can be a time consuming operation.

As the performance of computer systems increases, the non-volatile memory manufacturers are under pressure to increase their memory performance in order to keep from becoming performance bottlenecks in computer systems. Additionally, non-volatile memory manufacturers are attempting to market their memories as solid state drives, thus requiring increasing program and read performance.

For the reasons stated above, and for other reasons stated below that will become apparent to those skilled in the art upon reading and understanding the present specification, there is a need in the art to increase memory program and sense operation performance.

DETAILED DESCRIPTION

Figure 3:
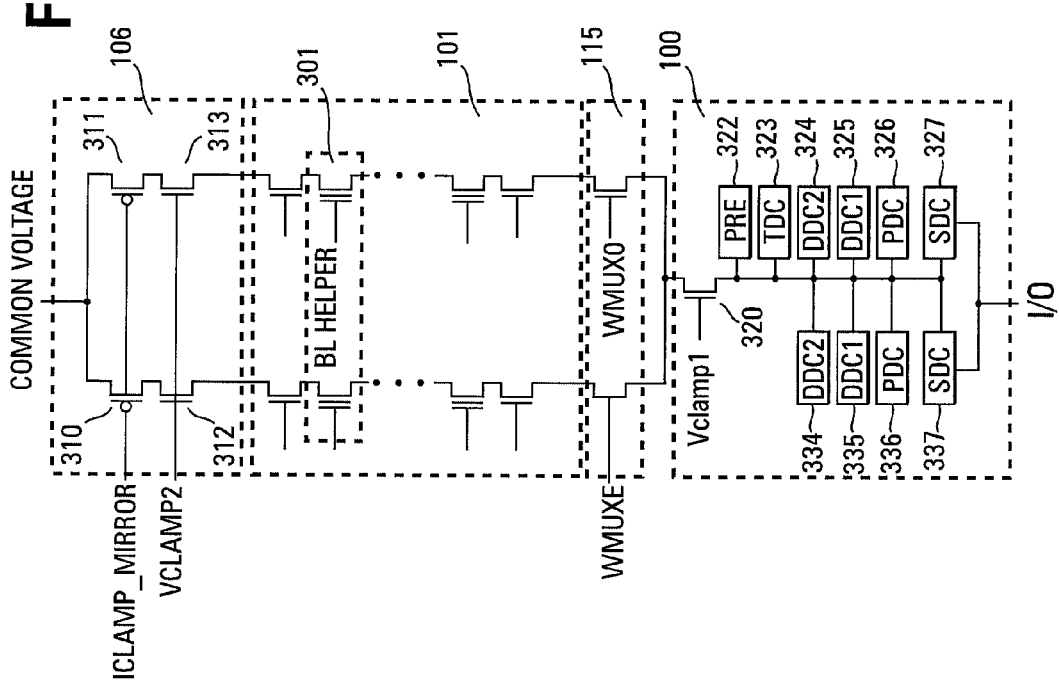
FIG. 3 shows a schematic diagram of one embodiment of the memory device of FIG. 1.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
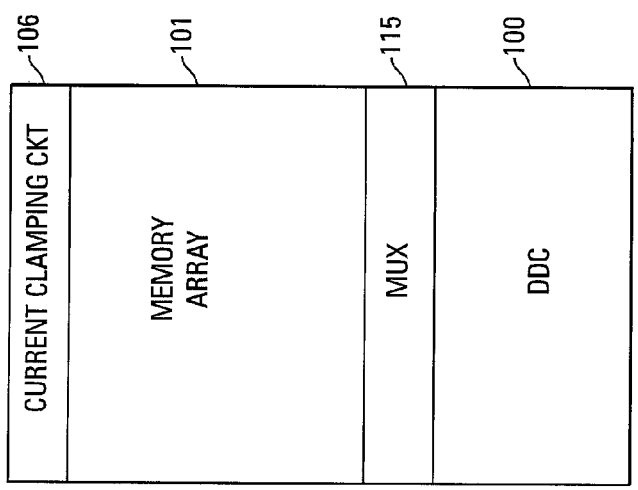
FIG. 1 shows a block diagram of one embodiment of a memory device in accordance with the all bit line sense and program operations of the present embodiments.

FIG. 1 illustrates a block diagram of one embodiment of a memory device that incorporates the all bit line sense (e.g., read/verify) and program operations of the present embodiments. The memory device is comprised of a memory array portion 101, a current clamping circuit 106, a multiplexing circuit 115, and a dynamic data cache (DDC) 100.

Prior art sense and program operations are performed on alternate bit lines. In other words, during one program operation, the odd bit lines are programmed. A subsequent program operation then programs the even bit lines. The sense and program operations of the present embodiments read and program all of the bit lines during the same operation.

The current clamping circuit 106 is comprised of a transistor circuit that provides a constant current to the data lines (e.g., bit lines) during a sense operation. When all of the bit lines are enabled, they have a tendency to couple each other down to a lower voltage. The constant current provided by the current clamping circuit 106 recovers these coupled down bit lines.

The multiplexing circuit 15 selects between two or more bit lines of the memory array 101. As described subsequently with reference to the more detailed schematic of FIG. 3 and the timing diagrams of FIGS. 5 and 6, the control signals to the multiplexing circuit 115 select which bit line is enabled to the DDC 100.

The DDC 100, as illustrated and described subsequently with reference to FIG. 3, provides temporary storage of data that has been sensed or is being programmed into the memory array 101. The DDC 100 can also provide precharging voltages for the bit lines during the sense and program operations.

Figure 2:
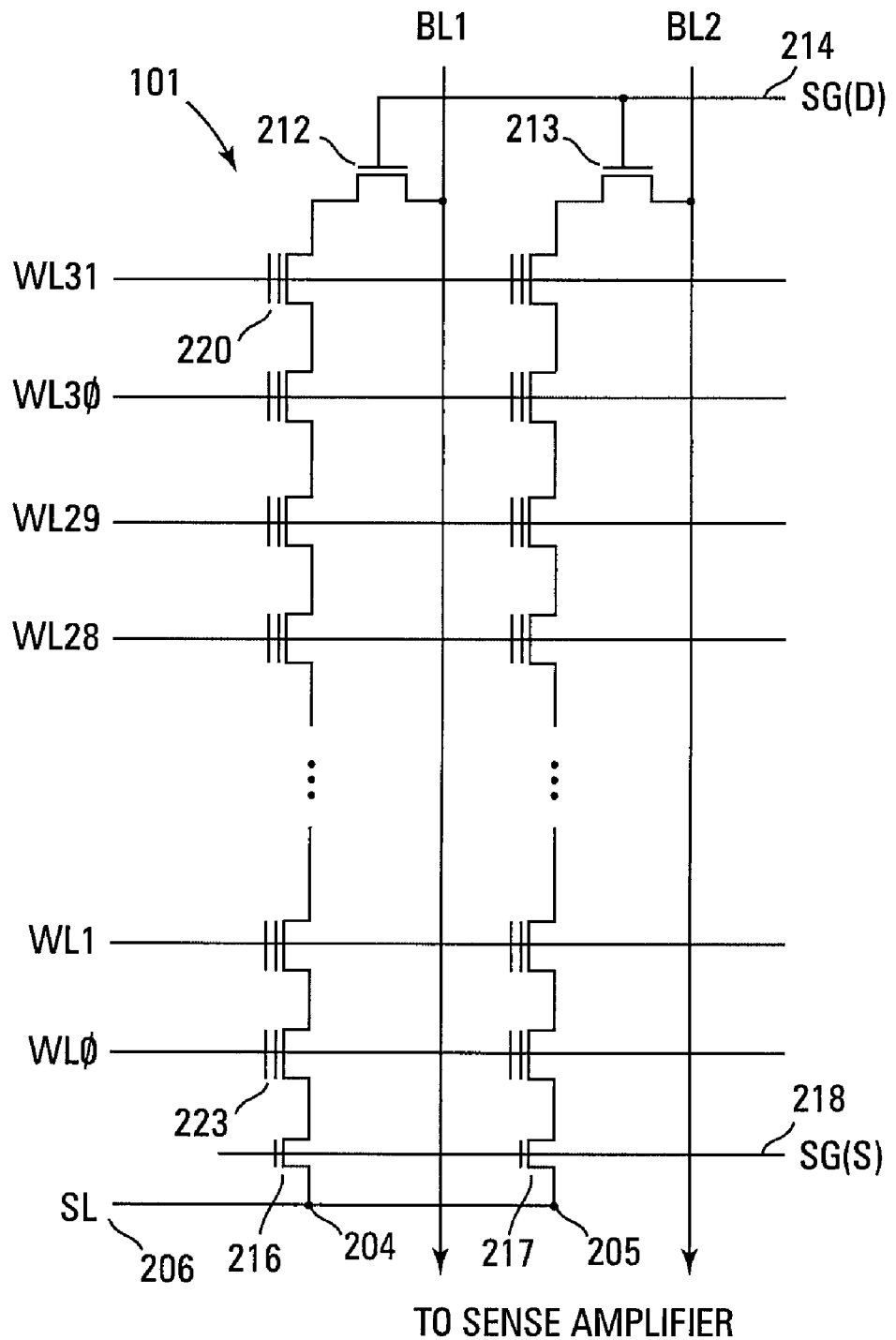
FIG. 2 shows schematic diagram of one embodiment of series NAND strings of memory cells.

One embodiment of the memory array 101 portion of the memory device of FIG. 1 is illustrated in FIG. 2. FIG. 2 illustrates a schematic diagram of a portion of a NAND architecture memory array 101 comprising series strings of non-volatile memory cells as illustrated in FIG. 1. While FIG. 2 and the subsequent discussions refer to a NAND memory device, the present embodiments are not limited to such an architecture but can be used in other memory device architectures as well.

The memory array is comprised of an array of non-volatile memory cells 101 (e.g., floating gate) arranged in columns such as series strings 204, 205. Each of the cells 201 are coupled drain to source in each series string 204, 205. An access line (e.g. word line) WL0-WL31 that spans across multiple series strings 204, 205 is connected to the control gates of each memory cell in a row in order to bias the control gates of the memory cells in the row. The bit lines BL1, BL2 are eventually connected to sense amplifier circuits (not shown) that detect the state of each cell by sensing current on a particular bit line.

Each series string 204, 205 of memory cells is coupled to a source line 206 by a source select gate 216, 217 and to an individual bit line BL1, BL2 by a drain select gate 212, 213. The source select gates 216, 217 are controlled by a source select gate control line SG(S) 218 coupled to their control gates. The drain select gates 212, 213 are controlled by a drain select gate control line SG(D) 214.

Each memory cell can be programmed as a single level cell (SLC) or multilevel cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC can have multiple $V_t$ voltage ranges that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

FIG. 3 illustrates a more detailed schematic of one embodiment of the memory device of FIG. 1. For purposes of clarity, only one pair of odd/even bit lines are shown and described in this figure. However, it is understood by one skilled in the art that the memory array 101 can be comprised of hundreds of thousands or millions of bit lines, depending on the memory density.

The current clamping circuit 106 is comprised of a common voltage pulling up each bit line through two transistors 310-313 coupled in series. The current clamping circuit 106 for each bit line is comprised of a PMOS transistor 310, 311 coupled in series to an NMOS transistor 312, 313. In an alternate embodiment, the PMOS transistors 310, 311 can be NMOS transistors if the logic of the control signal that turns them on is reversed.

A first control signal, ICLAMP_MIRROR, is coupled to the control gates of each PMOS transistor 310, 311. A second control signal, VCLAMP2, is coupled to the control gates of each NMOS transistor 312, 313. The operation of these control signals is described in greater detail with reference to the timing diagrams of FIGS. 5 and 6. However, it can be seen in this Figure that when the ICLAMP_MIRROR signal is low to turn on the PMOS transistor 310, 311 and the VCLAMP2 signal is high to turn on the NMOS transistor 312, 313, the bit lines are pulled up to the common voltage.

The function and composition of the memory array 101 has been described previously with reference to FIG. 2. This circuit also comprises a bit line helper circuit 301 that assists in precharging the bit lines during a sense operation. The bit line helper circuit 301 is not shown in greater detail since it can take the form of any circuit that couples each bit line to the precharge circuit 322 of the DDC 100 and is known by those skilled in the art. For example, one bit line helper circuit might comprise one transistor in which the biasing of the control gate determines whether the transistor is turned on and the bit line is charged.

The memory device is further comprised of a multiplexing circuit 115 that connects each odd/even bit line pair of the memory array 101 to the dynamic data cache (DDC) circuit 100. The multiplexing circuit 115 is comprised of a transistor couple to each bit line. Each transistor has a control signal that turns on the transistor, as shown in the timing diagrams of FIGS. 5 and 6, as required to allow the bit line access to the DDC 100. A WMUXE control signal enables transistors connected to even bit lines and a WMUXO control signal enables transistors connected to odd bit lines. Since the illustrated embodiment uses NMOS transistors, the WMUXE and WMUXO signals are active high to turn on the transistors. However, an alternate embodiment could use active low signals if PMOS transistors were substituted. The circuit shown for the DDC 100 is repeated for each odd/even pair of bit lines. In still other embodiments, other types of enable switches can be used in place of the WMUXE and WMUXO transistors.

The DDC circuit 100 is comprised of an access transistor 320 that connects the DDC 100 to the multiplexing circuit 115. When the control signal VCLAMP1 is high, this transistor 320 is turned on and connected to the bit line that is selected by the multiplexing circuit 115. As in above descriptions, the NMOS access transistor 320 can be a PMOS transistor if inverse logic for the control signal VCLAMP1 is used.

The DDC circuit 100 is further comprised of a precharge circuit 322. When the multiplexing circuit 115 connects one of the odd or even bit lines to the DDC 100, the precharge circuit 322 precharges that particular bit line, through the odd or even bit line helper circuit 301, prior to a sense operation.

A temporary data cache (TDC) 323 is used to temporarily store data during a program or sense operation. The data is stored in the TDC 323 before being moved to or after being moved from the primary data cache (PDC) 326, 336, the secondary data cache (SDC) 327, 337, DDC1 325, 335, or DDC2 324, 334. If the present operation is a sense operation, the data in the TDC 323 is moved to the I/O line for use by external circuits such as a microprocessor that initiated the read operation. If the present operation is a program operation, the data in the TDC 323 is moved to the selected memory cell during the portion of the operation in which the selected memory cell is programmed with the data.

The main data storage portion of the DDC 100 is comprised of two DDC2 circuits 324, 334, two DDC1 circuits 325, 335, two PDC circuits 326, 336, and two SDC circuits 327, 337. These "mirror image" circuits are used for storing data from both the odd and even bit lines to which each DDC 100 is connected. In other words, one side of the DDC2 324, DDC1 325, PDC 326, and SDC 327 might be used for the even bit line while the other side of the DDC2 334, DDC1 335, PDC 336, and SDC 337 can then be used for the odd bit line. Both of the SDC circuits 327, 337 are coupled to the I/O line for either receiving data for programming or transmitting data read from their respective bit lines to an external circuit.

The DDC1 and DDC2 circuits 324, 325, 334, 335 are used for controlling multi-level programming and storing multi-level data for selected memory cells in combination with the PDC circuits 326, 336. In an SLC programming operation, if a logical '0' is being programmed to a selected memory cell, the bit line voltage for that cell is set to 0V by the PDC 326, 336. If a logical '1' is to be programmed, the bit line voltage is set to $V_{CC}$ from the PDC 326, 336. A logical '1' is an erased state and means no programming is to be done, thus the $V_{CC}$ on the bit line inhibits further programming of any cells coupled to that particular bit line.

In an MLC programming operation, the bit lines are biased between 0V and $V_{CC}$ from the DDC1 and DDC2 circuits 324, 325, 334, 335. DDC1 325, 335 handles providing voltages between approximately 0.5V to 1V to the bit lines while DDC2 324, 334 handles providing other voltages to the bit lines.

The voltages provided by the DDC1 and DDC2 circuits 324, 325, 334, 335 are responsible for slowing down the programming speed of selected memory cells once the selected memory cells are programmed higher than a certain threshold voltage ($V_{t1}$). The DDC1 and DDC2 circuits 324, 325, 334, 335 operate as follows: if the selected cell threshold ($V_t$) is $V_{t1}$, the bit line voltage is set to 0V from the PDC 326, 336. If $V_{t1} < V_t < V_{t2}$, the bit line voltage is set between 0.5V and 1V by DDC1 325, 335, where $V_{t2}$ is a voltage that is less than the target $V_t$ for the selected cell and $V_{t1}$ is always less than $V_{t2}$. If $V_t > V_{t2}$, the bit line voltage is set to $V_{CC}$ to inhibit the selected cell from further programming. An example of one embodiment of $V_{t1}$ and $V_{t2}$ voltage is $V_{t1}$=2.0V, $V_{t2}$=2.4V, and the target $V_t$ for the selected memory cell is 3.4V. In such an embodiment, the selected memory cell would be programmed between 2.4V and 3.4V.

The PDC circuits 326, 336 stores data that has been sensed from their bit line's respective sense operation. For example, one PDC 336 might store the data from a sense operation on an even bit line and the other PDC 326 might store the data from a sense operation on an odd bit line. Additionally, the PDC circuits 326, 336 store data for programming into their respective bit lines. Data from the PDC 326, 336 is transferred to the TDC 323 immediately prior to programming. Data written to the PDC 326, 336 is transferred from the TDC 323 immediately after the sense operation.

The SDC circuits 327, 337 are secondary caches that store data from an external circuit (e.g., microprocessor) for programming into the respective bit line (i.e., odd or even) to which the SDC 327, 337 is assigned. The SDC 327, 337 also acts as a pass through circuit for data that is output by the DDC 100.

Figure 4:
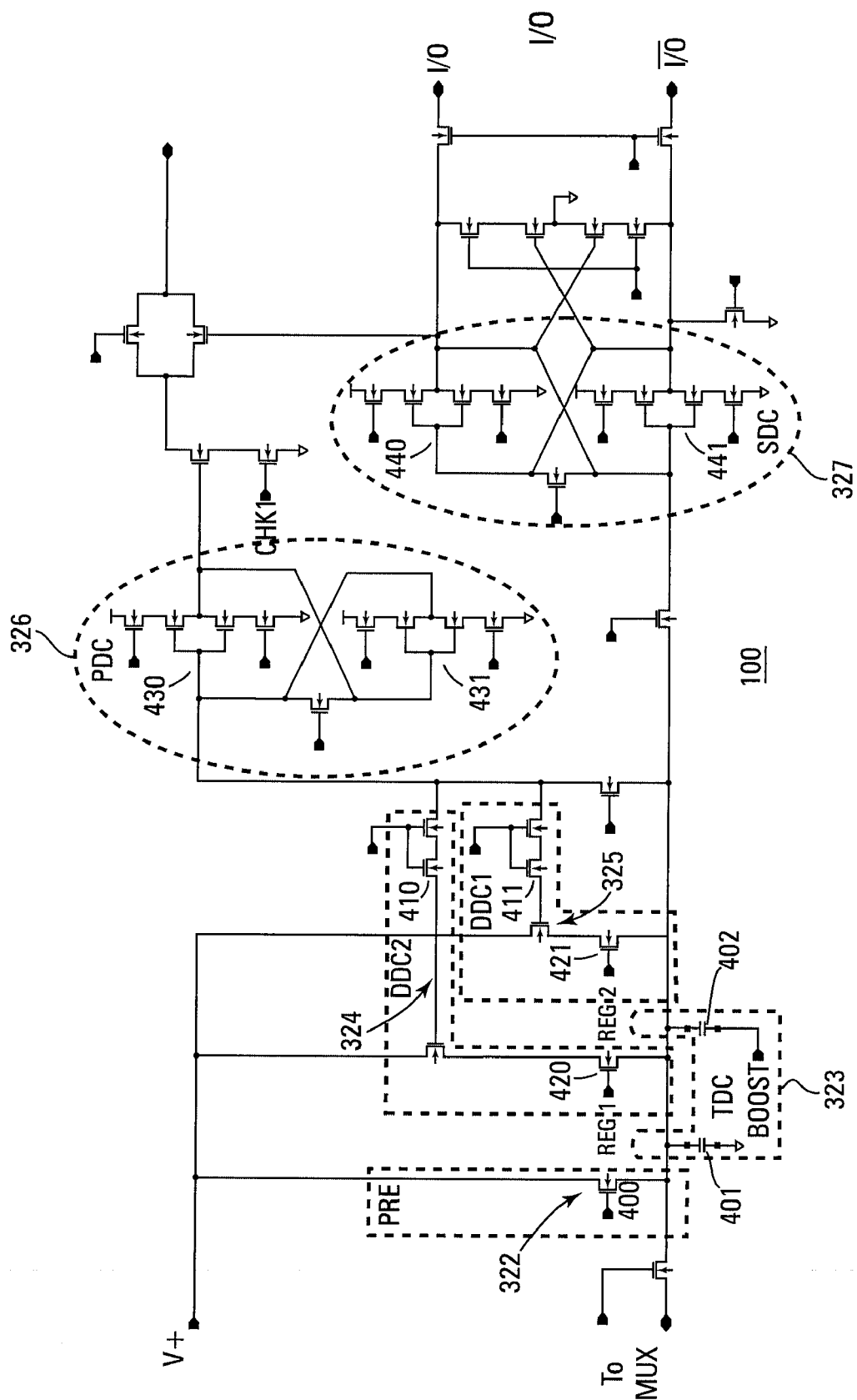
FIG. 4 shows a schematic diagram of one embodiment of the dynamic data cache in accordance with the memory device of FIGS. 1 and 3.

FIG. 4 illustrates a schematic diagram of one embodiment of the DDC 100 of FIGS. 1 and 3. This circuit 100 shows the PRE 322 precharge circuit and the TDC 323 temporary data cache as well as half of the data storage portion of the DDC 100 that includes the DDC2 324, DDC1 325, PDC 326, and SDC 327. The other half of the data storage portion of the DDC 100 is the same as that illustrated.

The PRE circuit 322 is comprised of a transistor 400 coupled to a voltage source V+. When the transistor is turned on, the odd or even bit line to which the precharge circuit 322 is coupled, through the multiplexing circuit, at the time is charged up to the V+ voltage.

The TDC circuit 323 is comprised of two capacitors 401, 402 for temporarily storing data input to the circuit 323. One capacitor 402 is also connected to a voltage boost input BOOST that scales the stored data to a higher voltage level. The BOOST signal can be used when a higher voltage is necessary or desired for the remainder of the DDC 100.

The DDC1 and DDC2 circuits 324, 325 are comprised of substantially similar circuits that include a transistor 420, 421 coupled to a regulated voltage REG1, REG2. The circuits 324, 325 additionally have transistor circuits 410, 411 for controlling biasing of the bit lines as discussed previously.

The PDC circuit 326 includes dual transistor flip-flop circuits 430, 431 for storing the sensed data or the data to be programmed. The SDC circuit 327 is also comprised of dual transistor flip-flop circuits 440, 441 that have substantially the same configuration as the PDC flip-flop circuits 430, 431. The SDC circuit 327 is coupled to the I/O of the DDC 100. In the illustrated embodiment, the I/O connection is comprised of an I/O connection and an $\overline{I/O}$ connection.

Figure 5:
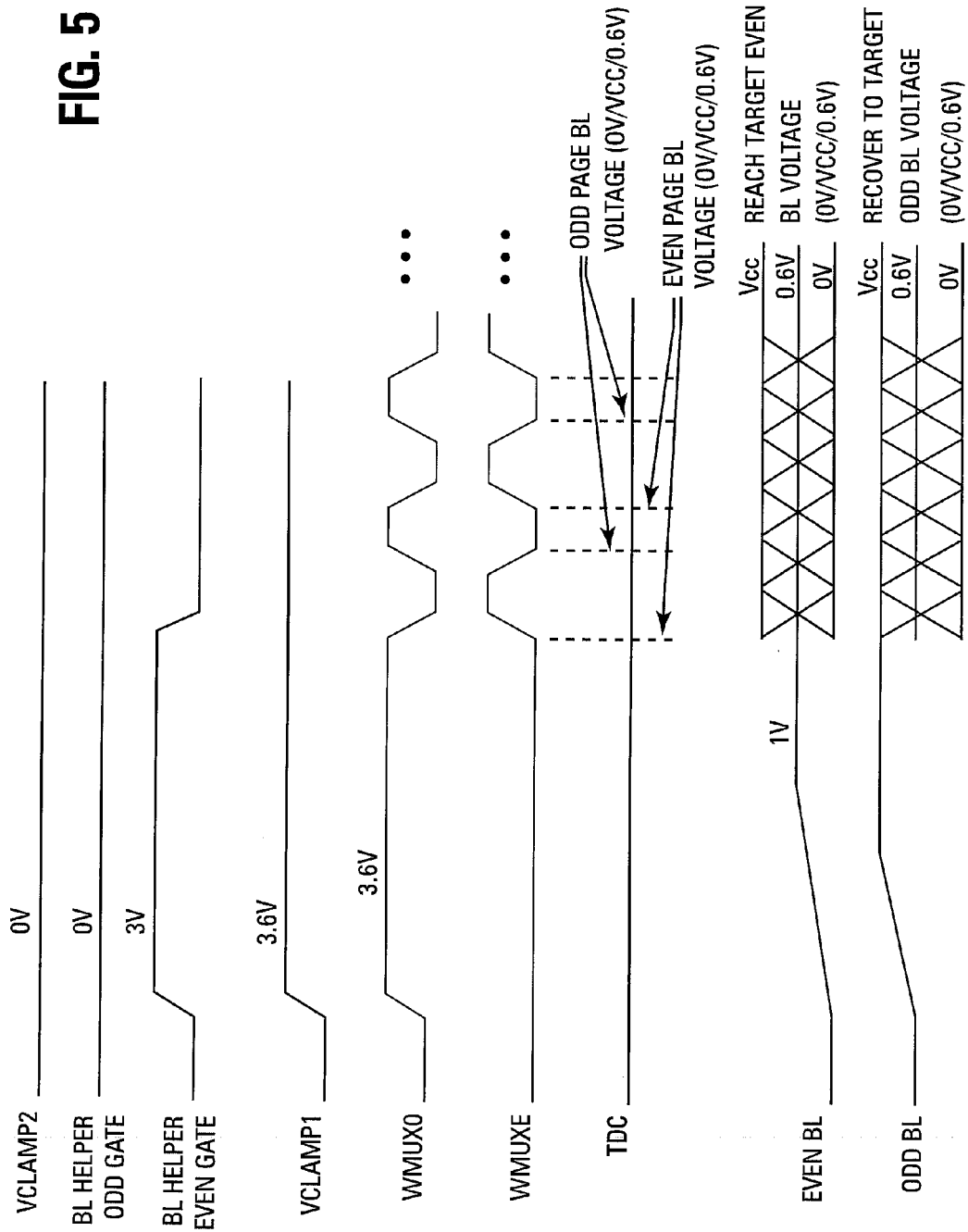
FIG. 5 shows a timing diagram of signals of one embodiment of a method for a programming operation in accordance with the schematic diagram of FIG. 3.

FIG. 5 illustrates a timing diagram of one embodiment of a method for all bit line programming with reference to the signals of the schematic diagram of FIG. 3. The illustrated method overcomes the bit line-to-bit line coupling that occurs when multiple adjacent bit lines are turned on at the same time during the all bit line programming and sensing operations. The particular voltage levels and times illustrated in the timing diagram are for purposes of illustration only as the present embodiments are not limited to any particular voltages or times.

During the all bit line programming operation, VCLAMP2 is at 0V so that the bit line clamping circuit is turned off. The control gate for the odd bit line helper circuit is at 0V so that the odd bit line is not charged. The control gate for the even bit line helper circuit is biased at a voltage (e.g., 3V) that turns the even helper circuit on and charges the even bit line.

The VCLAMP1 signal to the DDC enable transistor is set to a voltage (e.g., 3.6V) that turns on that transistor and, thus, enables access to the DDC circuit. The odd multiplexing circuit control signal WMUXO is also set to a voltage (e.g., 3.6V) that turns on the odd bit line multiplexing transistor. The odd bit lines are now connected to the DDC through the multiplexing circuit and the VCLAMP1 transistor of the DDC. The DDC can now provide the proper bit line voltage to the odd bit lines (e.g., 0V, 0.6V, or $V_{CC}$) depending on the selected memory cell target programming level.

The 0V bit line voltage allows the selected memory cells coupled to the odd bit lines to be programmed normally. The 0.6V bit line voltage slows the programming of the selected memory cells on the odd bit lines. The $V_{CC}$ bit line voltage inhibits programming of any memory cells coupled to the odd bit lines.

During the initial time that WMUXO is high, WMUXE is at a logic low of 0V so that the even multiplexing transistor is turned off, disabling access to the DDC by the even bit lines. The long period that the WMUXO signal is high prior to the pulsing of WMUXO and WMUXE provides the odd bit lines the time required to pre-charge to the target voltage due to their higher bit line capacitance than the even bit lines. This can be seen in the timing diagram EVEN BL and ODD BL signals. The ODD BL is shown charging up to its target bit line voltage (e.g., 0V, 0.6V, $V_{CC}$) while the EVEN BL signal is shown slowly increasing due to bit line-to-bit line coupling with the odd bit lines. The EVEN BL voltage might precharge to 1V, or some other low voltage. The ODD BL voltage, in one embodiment, precharges to $V_{CC}$.

The WMUXO and WMUXE signals then pulse for the remainder of the programming operation. When the WMUXO signal is low, the WMUXE signal is high. This alternates access of the odd and even bit lines to the DDC. In other words, when the WMUXO signal pulses high, the odd bit lines are coupled to the DDC and the even bit lines are disconnected from the DDC. When the WMUXE signal pulses high, the even bit lines are coupled to the DDC and the odd bit lines are disconnected from the DDC. Thus, as shown in the TDC signal, the initial dotted line area of the TDC signal is where an even page of bit lines are at their target voltage from the DDC connection. The next area of the TDC signal is where an odd page of bit lines are at their target voltage from the DDC connection. This pattern repeats until the programming operation is complete. The pattern of WMUXO and WMUXE pulses enables all of the bit lines of a memory block to be programmed during one program operation, thus increasing programming performance.

The even page of bit lines, when coupled to the DDC, uses one side of the DDC circuit. For example, referring to FIG. 3, the even page of bit lines might use the DDC2 334, DDC1 335, PDC 336, and SDC 337. The odd page of bit lines would then use the DDC2 324, DDC1 325, PDC 326, and SDC 327.

During the time that the WMUXO and WMUXE signals are pulsing, the EVEN BL and ODD BL signals are oscillating. This shows that when the even page of bit lines is reaching their target bit line voltage, the odd page of bit lines is recovering to their target bit line voltage.

During each WMUXO or WMUXE pulse, a series of programming pulses are applied to the selected word line of the memory block being programmed. The programming pulses start at an initial programming pulse (e.g., 15V) and increment up to a maximum programming pulse (e.g., 20V) until the selected memory cells are successfully programmed. During these programming pulses, the biasing from the DDC of each odd or even page of bit lines determines whether a memory cell is programmed normally (i.e., bit line voltage of 0V), programmed slower (i.e., bit line voltage of 0.6V), or inhibited from programming (i.e., bit line voltage of $V_{CC}$).

Figure 6:
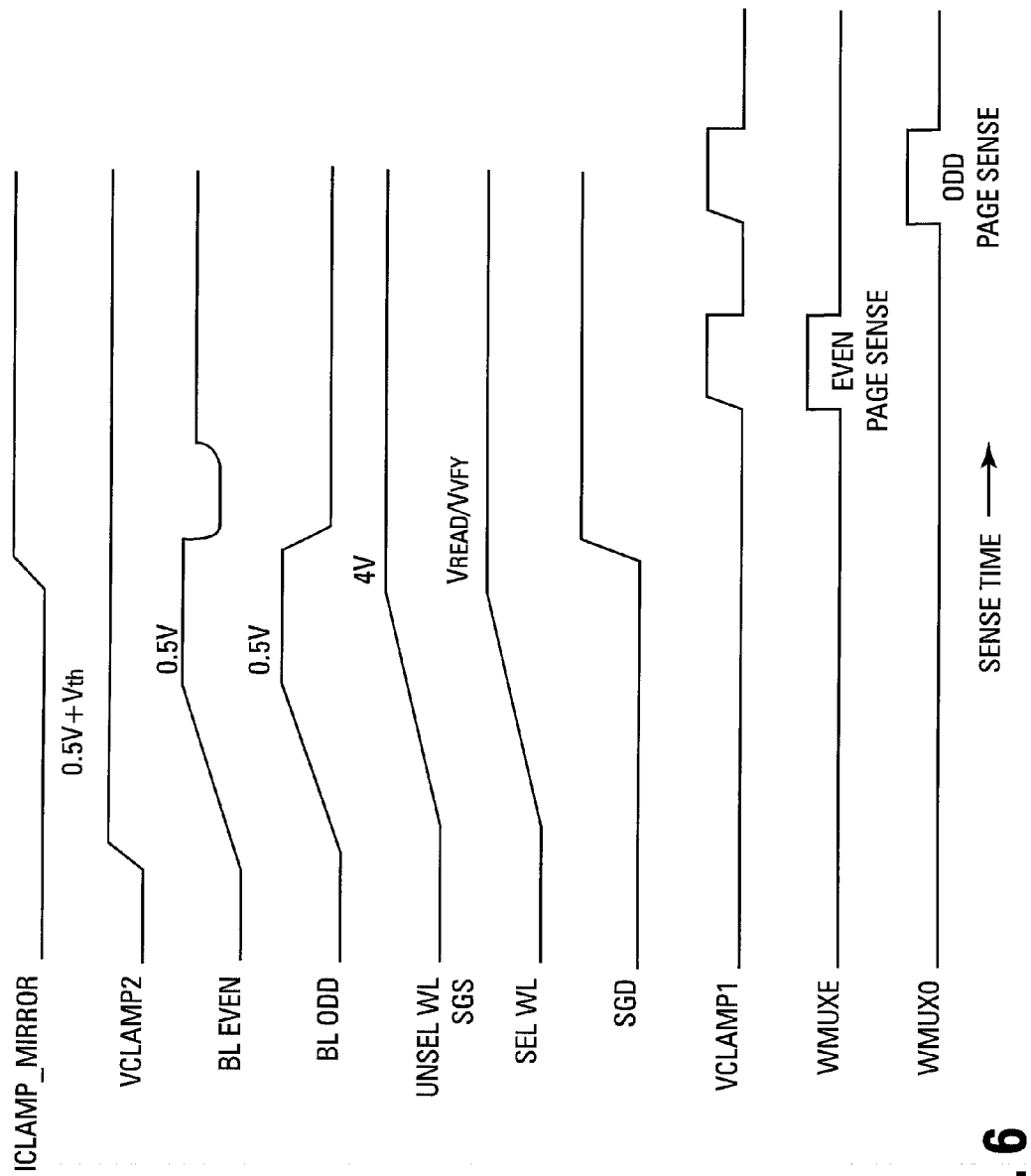
FIG. 6 shows a timing diagram of signals of one embodiment of a method for a sense operation in accordance with the schematic diagram of FIG. 3.

FIG. 6 illustrates a timing diagram of one embodiment of a method for all bit line reading with reference to the signals of the schematic diagram of FIG. 3. Initially, VCLAMP2 is biased at 0.5V more than its threshold voltage. Also during this initial perio, the other bit line clamping circuit signal, ICLAMP_MIRROR is at 0V so that those transistors are turned on as well. The VCLAMP2 transistors remain on during the entire all bit line read operation while the ICLAMP_MIRROR transistors are turned off when this signal goes high.

Once the bit line clamping circuit is turned on, the bit lines (BL EVEN and BL ODD) are pulled up to some low voltage (e.g., 0.5V) by the common voltage (e.g., 2V) of the clamping circuit. The unselected word lines at some high pass voltage (e.g., 4V) that enables them to pass the read data through from the memory cells on the selected word line. The selected word line is biased at a $V_{read}/V_{verify}$ voltage (e.g., 1.0V) to enable the selected memory cells on the selected word line for reading.

The select gate drain signal is biased at a voltage to turn on the select gate drain transistor, thus coupling the series string of memory cells to the bit line. The VCLAMP1 signal then pulses for the remainder of the read/verify operation. Each VCLAMP1 pulse turns on the VCLAMP1 transistor of the DDC to couple the DDC to the odd or even page of bit lines being read in response to the multiplexing circuit.

The WMUXE and WMUXO signals alternate pulsing so that during one time, an even page of bit lines is enabled and during a second time an odd page of bit lines is enabled. Each WMUXE and WMUXO pulse coincides with a different VCLAMP1 pulse as shown. Thus, all of the bit lines of a memory block being sensed are read during a read operation.

Figure 7:
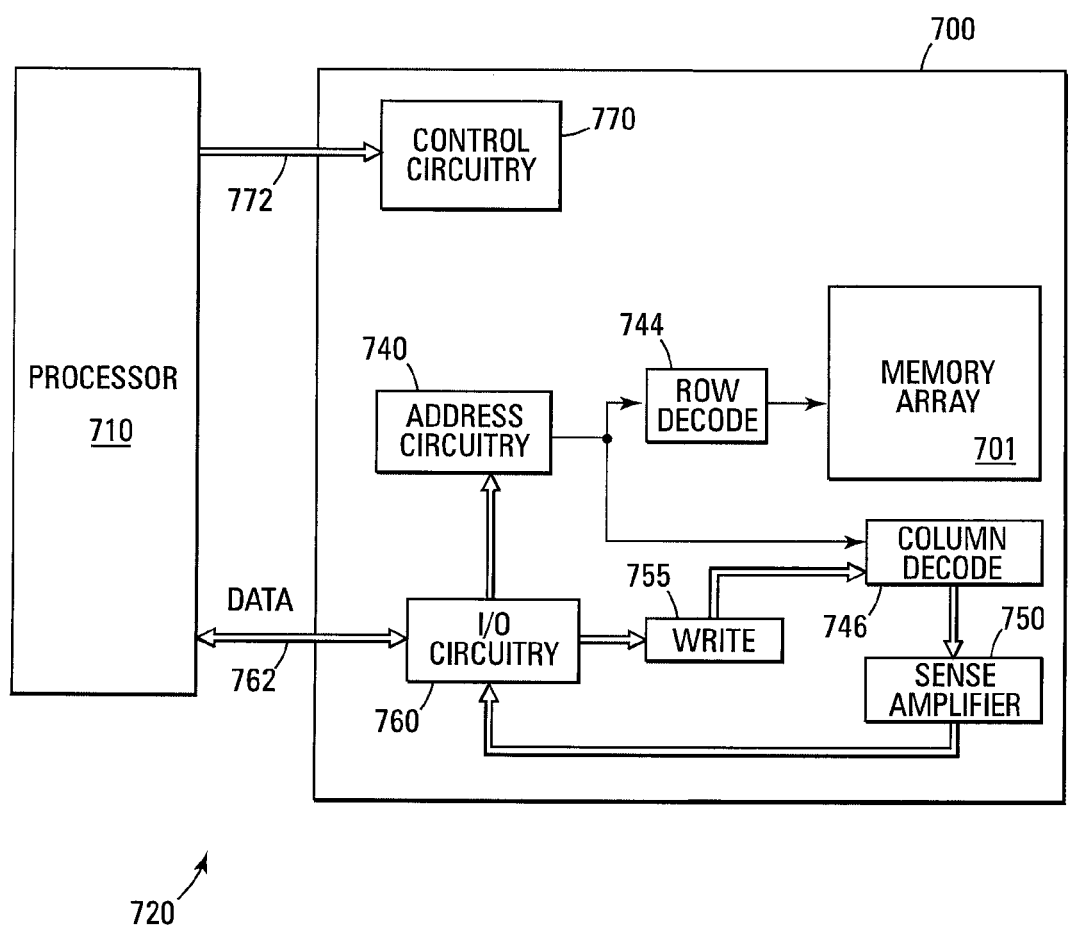
FIG. 7 shows a block diagram of one embodiment of a memory system that incorporates the present embodiments of the memory device and methods for read/verify and programming of the present embodiments.

FIG. 7 illustrates a functional block diagram of a memory device 700. The memory device 700 is coupled to an external controller 710. The controller 710 may be a microprocessor or some other type of controlling circuitry. The memory device 700 and the controller 710 form part of a memory system 720. The memory device 700 has been simplified to focus on features of the memory that are helpful in understanding the present invention.

The memory device 700 includes an array 101 of non-volatile memory cells, such as the one illustrated previously in FIG. 1. The memory array 101 is arranged in banks of word line rows and bit line columns. In one embodiment, the columns of the memory array 101 are comprised of series strings of memory cells as illustrated in FIG. 2. As is well known in the art, the connections of the cells to the bit lines determines whether the array is a NAND architecture, an AND architecture, or a NOR architecture.

Address buffer circuitry 740 is provided to latch address signals provided through the I/O circuitry 760. Address signals are received and decoded by a row decoder 744 and a column decoder 746 to access the memory array 101. It will be appreciated by those skilled in the art, with the benefit of the present description, that the number of address input connections depends on the density and architecture of the memory array 101. That is, the number of addresses increases with both increased memory cell counts and increased bank and block counts.

The memory device 700 reads data in the memory array 101 by sensing voltage or current changes in the memory array columns using sense amplifier circuitry 750. The sense amplifier circuitry 750, in one embodiment, is coupled to read and latch a row of data from the memory array 730. Data input and output buffer circuitry 760 is included for bidirectional data communication as well as address communication over a plurality of data connections 762 with the controller 710. Write circuitry 755 is provided to write data to the memory array.

Memory control circuitry 770 decodes signals provided on control connections 772 from the external controller 710. These signals are used to control the operations on the memory array 101, including data read, data write (program), and erase operations. The memory control circuitry 770 may be a state machine, a sequencer, or some other type of control circuitry to generate the memory control signals. In one embodiment, the memory control circuitry 770 is configured to execute the embodiments of the sense method of the present disclosure.

The flash memory device illustrated in FIG. 7 has been simplified to facilitate a basic understanding of the features of the memory. A more detailed understanding of internal circuitry and functions of flash memories are known to those skilled in the art.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming memory cells in a memory block, the method comprising:
 precharging a first plurality of data lines coupled to a first plurality of memory cells;
 precharging a second plurality of data lines coupled to a second plurality of memory cell;
 alternately coupling the second plurality of data lines and the first plurality of data lines to a dynamic data cache; and
 the dynamic data cache generating one of a plurality of voltages to selectively bias the second plurality of data lines and the first plurality of data lines wherein the plurality of voltages are configured to enable: normal programming, programming that is slower than normal programming, and inhibition of programming.

2. The method of claim 1 wherein the plurality of voltages comprise 0V, 0.6V, and $V_{CC}$.

3. The method of claim 1 wherein alternately coupling the second plurality of data lines and the first plurality of data lines comprises generating a plurality of multiplexing pulses wherein one pulse is high while another pulse is low.

4. The method of claim 3 and further including biasing a first multiplexing transistor with a first pulse and biasing a second multiplexing transistor with a second pulse.

5. The method of claim 1 wherein the second plurality of data lines is selectively coupled to a first portion of the dynamic data cache and the first plurality of data lines is selectively coupled to a second portion of the dynamic data cache.

6. A method for programming memory cells in a memory block, the method comprising:
 precharging a first data line that charges slower than a second data line to a first voltage;
 precharging the second data line to a second voltage;
 enabling access for the first and second data lines to a dynamic data cache;
 alternately coupling memory cells coupled to the first data line and memory cells coupled to the second data line to the dynamic data cache; and
 the dynamic data cache generating one of a plurality of voltages to selectively bias the first data line and the second data line wherein each of the plurality of voltages are configured to enable one of: normal programming, programming that is slower than normal programming, or inhibition of programming.

7. The method of claim 6 wherein the first data line is adjacent to the second data line.

8. The method of claim 6 wherein the first voltage is between 0V and $V_{CC}$ and the second voltage is $V_{CC}$.

9. The method of claim 6 and further including biasing a selected access line with a series of programming pulses during a time when memory cells coupled to the first or the second data lines are coupled to the dynamic data cache.

10. The method of claim 6 wherein alternately coupling memory cells coupled to the first data line and memory cells coupled to the second data line to the dynamic data cache comprises applying a plurality of pulse signals to a multiplexing circuit to select between the first data line and the second data line.

11. The method of claim 10 wherein a first signal of pulses selects the first data line and a second signal of pulses selects the second data line.

12. The method of claim 11 and further including applying a series of programming pulses to a word line of memory cells being programmed during each pulse of either the first signal of pulses or the second signal of pulses.

13. The method of claim 11 wherein the first signal of pulses is in a high state when the second signal of pulses is in a low state.

* * * * *